(12) United States Patent
Tsuda et al.

(10) Patent No.: US 12,047,106 B2
(45) Date of Patent: Jul. 23, 2024

(54) RADIO-FREQUENCY MODULE AND COMMUNICATION DEVICE

(71) Applicant: Murata Manufacturing Co., Ltd., Kyoto (JP)

(72) Inventors: Motoji Tsuda, Kyoto (JP); Yukiya Yamaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 293 days.

(21) Appl. No.: 17/646,941

(22) Filed: Jan. 4, 2022

(65) Prior Publication Data

US 2022/0123774 A1 Apr. 21, 2022

Related U.S. Application Data

(63) Continuation of application No. PCT/JP2020/024857, filed on Jun. 24, 2020.

(30) Foreign Application Priority Data

Aug. 29, 2019 (JP) .................................. 2019-156568

(51) Int. Cl.
*H04B 1/38* (2015.01)
*H04B 1/04* (2006.01)
(Continued)

(52) U.S. Cl.
CPC ................. *H04B 1/38* (2013.01); *H04B 1/04* (2013.01); *H04B 1/1607* (2013.01); *H04B 1/18* (2013.01); *H04B 2001/0408* (2013.01)

(58) Field of Classification Search
CPC . H04B 1/03; H04B 1/036; H04B 1/04; H04B 2001/0408; H04B 1/1036;
(Continued)

(56) References Cited

U.S. PATENT DOCUMENTS 6,649,998 B2 * 11/2003 Song ....................... H01L 23/66
257/532
6,825,548 B2 * 11/2004 Fujioka ................... H01L 23/66
257/E21.627

(Continued)

FOREIGN PATENT DOCUMENTS

JP 2011-040602 A 2/2011
WO 2018/101384 A1 6/2018

OTHER PUBLICATIONS

International Search Report issued for Application No. PCT/JP2020/024857 dated Aug. 11, 2020.
(Continued)

*Primary Examiner* — Quochien B Vuong
(74) *Attorney, Agent, or Firm* — Pearne & Gordon LLP

(57) ABSTRACT

A radio-frequency module (1) includes a module substrate (70) having major surfaces (701 and 702) opposite to each other, external connection terminals (90a and 90b) disposed on the major surface (702), a power amplifier (11) having major surfaces (111 and 112) opposite to each other and being disposed on the major surface (702) such that the major surface (111) is a mounting surface on the module substrate (70), a bonding wire (45) coupled to the major surface (112), and a heat dissipation electrode (91) disposed apart from the power amplifier (11) on the major surface (112) side with respect to the power amplifier (11) and coupled to the bonding wire (45).

19 Claims, 3 Drawing Sheets

(51) Int. Cl.
*H04B 1/16* (2006.01)
*H04B 1/18* (2006.01)

(58) Field of Classification Search
CPC .......... H04B 1/1607; H04B 1/18; H04B 1/40; H01L 23/34
See application file for complete search history.

(56) References Cited

U.S. PATENT DOCUMENTS

| | | | |
|---|---|---|---|
| 7,348,842 B2* | 3/2008 | Ichitsubo | H03F 3/24 |
| | | | 330/307 |
| 7,978,031 B2* | 7/2011 | Goi | H04B 1/04 |
| | | | 361/761 |
| 2011/0037170 A1 | 2/2011 | Shinohara | |
| 2012/0077449 A1* | 3/2012 | Ohashi | H04B 1/036 |
| | | | 455/114.3 |
| 2019/0273312 A1 | 9/2019 | Otsubo | |

OTHER PUBLICATIONS

Written Opinion issued for Application No. PCT/JP2020/024857 dated Aug. 11, 2020.

* cited by examiner

RADIO-FREQUENCY MODULE AND COMMUNICATION DEVICE

CROSS REFERENCE TO RELATED APPLICATION

This is a continuation of International Application No. PCT/JP2020/024857 filed on Jun. 24, 2020 which claims priority from Japanese Patent Application No. 2019-156568 filed on Aug. 29, 2019. The contents of these applications are incorporated herein by reference in their entireties.

BACKGROUND OF THE DISCLOSURE

Field of the Disclosure

The present disclosure relates to a radio-frequency module and a communication device.

Description of the Related Art

In mobile communication devices, such as mobile phones, particularly along with the development of multiband communication, circuit elements constituting a radio-frequency front-end circuit have increased.

Patent Document 1 discloses a semiconductor module (radio-frequency module) formed by mounting a plurality of electronic components on both surfaces of a wiring board. More specifically, a semiconductor chip forming a power amplifier is mounted on a back surface facing toward an external substrate (mounting printed circuit board (PCB)). Patent Document 1 explains that this structure can downsize the semiconductor module.

Patent Document 1: Japanese Unexamined Patent Application Publication No. 2011-40602

BRIEF SUMMARY OF THE DISCLOSURE

In the semiconductor module (radio-frequency module) described in Patent Document 1, the power amplifier is mounted on the back surface side of the wiring board and grounded via the wiring board.

In this case, the ground path to the external substrate extends through a planar wiring pattern along the mounting surface of the wiring board, resulting in a relatively long heat dissipation path. As a result, problems may arise in which increased thermal resistance due to the elongated heat dissipation path degrades the heat dissipation capability.

The present disclosure has been made to address the problem described above, and an object thereof is to provide a small radio-frequency module and a small communication device with an improved capability of dissipating the heat from a power amplifier.

To achieve the object described above, a radio-frequency module according to an aspect of the present disclosure includes a mounting board having a first major surface and a second major surface opposite to each other, an external connection terminal disposed on the second major surface, a power amplifier having a third major surface and a fourth major surface opposite to each other and being disposed on the second major surface such that the power amplifier is mounted at the third major surface on the mounting board, a first bonding wire coupled to the fourth major surface, and a heat dissipation electrode disposed apart from the power amplifier on a fourth major surface side with respect to the power amplifier and coupled to the first bonding wire.

A radio-frequency module according to an aspect of the present disclosure includes a mounting board having a first major surface and a second major surface opposite to each other, an external connection terminal disposed on the second major surface, a power amplifier having a third major surface and a fourth major surface opposite to each other and being disposed on the second major surface such that the power amplifier is mounted at the third major surface on the mounting board, and a heat dissipation electrode disposed on a fourth major surface side with respect to the power amplifier. The power amplifier includes an amplification element, a circuit board having the amplification element, and a through via extended through the circuit board in a direction from the third major surface to the fourth major surface. The heat dissipation electrode and the through via are coupled to each other.

The present disclosure can provide a small radio-frequency module and a small communication device with an improved capability of heat dissipation of a power amplifier.

DETAILED DESCRIPTION OF THE DISCLOSURE

Figure 1:
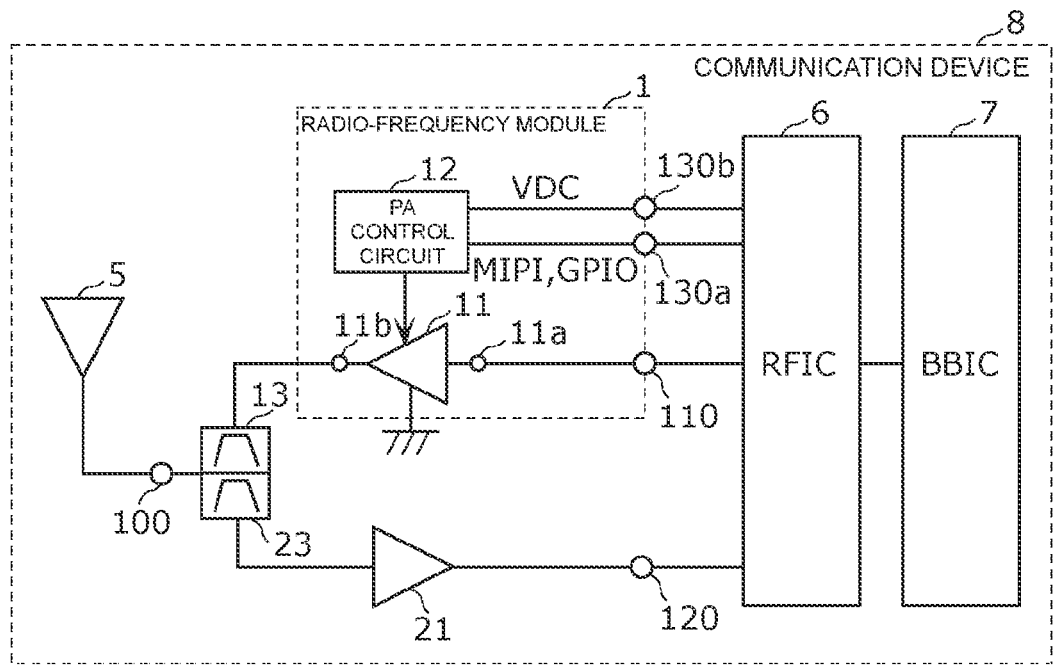
FIG. 1 is a circuit configuration diagram of a radio-frequency module and a communication device according to an embodiment.

Hereinafter, an embodiment of the present disclosure will be described in detail with reference to practical examples, modifications, and the drawings. It should be noted that the embodiment described below is a comprehensive or specific instance. Specifics including numerical values, shapes, materials, constituent elements, arrangements of the constituent elements, and modes of connection given in the following embodiment are mere instances and are not intended to limit the present disclosure. Among the constituent elements in the following embodiment, constituent elements not recited in any of the independent claims are described as arbitrary constituent elements. Furthermore, the size or size ratio of the constituent elements illustrated in the drawings is not necessarily presented in an exact manner.

In the following embodiment, the expression "A and B are coupled" includes by definition that A and B are in contact with each other and also that A and B are electrically coupled to each other via, for example, a conductive electrode and a conductive terminal.

In the following embodiment, the expression "A and B are joined" includes by definition that A and B are mechanically (physically) affixed to each other, and in particular that one surface of A and one surface of B are affixed to each other.

Embodiment

[1. Circuit Configuration of Radio-Frequency Module 1 and Communication Device 8]

FIG. 1 is a circuit configuration diagram of a radio-frequency module 1 and a communication device 8 according to the embodiment. As illustrated in the drawing, the communication device 8 includes the radio-frequency module 1, a transmit filter 13, a receive filter 23, a low-noise amplifier 21, a common terminal 100, a receive-signal output terminal 120, an antenna 5, a radio-frequency (RF) signal processing circuit (RFIC) 6, and a baseband signal processing circuit (BBIC) 7.

The RFIC 6 is a radio-frequency signal processing circuit configured to process a radio-frequency signal received or to be transmitted by the antenna 5. Specifically, the RFIC 6 processes by, for example, upconverting a baseband signal inputted from the BBIC 7 and outputs a transmit signal generated by the signal processing to a transmit-signal input terminal 110 of the radio-frequency module 1.

The RFIC 6 also functions as a controller for controlling the gain of a power amplifier 11 included in the radio-frequency module 1. Specifically, the RFIC 6 outputs to a control signal terminal 130a of the radio-frequency module 1 a digital control signal (for example, mobile industry processor interface (MIPI) or general-purpose input/output (GPIO) signal). The RFIC 6 also outputs to a control signal terminal 130b of the radio-frequency module 1 a direct-current voltage signal VDC to supply a supply voltage Vcc and a bias voltage Vbias to the power amplifier 11. A power amplifier (PA) control circuit 12 of the radio-frequency module 1 controls the gain of the power amplifier 11 by using the digital control signal and direct-current voltage signal inputted through the control signal terminals 130a and 130b. The controller may be provided outside the RFIC 6; for example, the controller may be provided in the BBIC 7.

The RFIC 6 processes by, for example, downconverting a receive signal inputted from the antenna 5 through the receive filter 23 and the low-noise amplifier 21 and outputs the receive signal generated by the signal processing to the BBIC 7.

The BBIC 7 performs signal processing by using an intermediate frequency range lower than radio-frequency signals transferred in the radio-frequency module 1. The signal processed by the BBIC 7 is used as, for example, an image signal for displaying an image or a sound signal for calls through a speaker.

The antenna 5 is electrically coupled to the common terminal 100 of the radio-frequency module 1. The antenna 5 emits a radio-frequency signal outputted from the radio-frequency module 1. The antenna 5 receives a radio-frequency signal from outside and outputs the radio-frequency signal to the radio-frequency module 1.

It should be noted that the antenna 5, the BBIC 7, the transmit filter 13, the receive filter 23, the low-noise amplifier 21, the common terminal 100, and the receive-signal output terminal 120 are non-essential constituent elements in the communication device 8 according to the present embodiment.

The radio-frequency module 1 includes the power amplifier 11, the PA control circuit 12, the transmit-signal input terminal 110, and the control signal terminals 130a and 130b.

The power amplifier 11 includes an input electrode 11a and an output electrode 11b. The power amplifier 11 is a transmit power amplifier configured to amplify a transmit signal inputted from the transmit-signal input terminal 110 and output the transmit signal to the transmit filter 13.

The PA control circuit 12 controls the gain of the power amplifier 11 by using the digital control signal and direct-current voltage signal inputted through the control signal terminals 130a and 130b. The PA control circuit 12 may be composed of a semiconductor integrated circuit (IC). The semiconductor IC is composed of, for example, a complementary metal-oxide semiconductor (CMOS). Specifically, the semiconductor IC is composed of a silicon on insulator (SOI) process. This yields inexpensive manufacturing of the semiconductor IC. The semiconductor IC may be made of at least any of GaAs, SiGe, and GaN. This enables output of radio-frequency signals with high amplification performance and low-noise performance.

The low-noise amplifier 21 is a receive low-noise amplifier configured to output a radio-frequency signal inputted through the receive filter 23 to the RFIC 6.

The power amplifier 11 and the low-noise amplifier 21 are composed of, for example, complementary metal oxide semiconductors (CMOSs), or GaAs field-effect transistors (FETs) or GaAs heterojunction bipolar transistors (HBTs).

The transmit filter 13 is disposed in a transmit path connecting the power amplifier 11 and the common terminal 100. The transmit filter 13 passes transmit signals in a predetermined transmit band out of the transmit signals amplified by the power amplifier 11. The receive filter 23 is disposed in a receive path connecting the low-noise amplifier 21 and the common terminal 100. The receive filter 23 passes receive signals in a predetermined receive band out of the receive signals inputted from the common terminal 100. In the present embodiment, the transmit filter 13 and the receive filter 23 form a duplexer that can simultaneously transmit and receive radio-frequency signals in predetermined frequency bands. A circuit element such as a switch may be disposed between the transmit filter 13 or the receive filter 23 and the common terminal 100.

The transmit filter 13 and the receive filter 23 may be, but not limited to, for example, surface acoustic wave filters, acoustic wave filters using a bulk acoustic wave (BAW), LC resonance filters, or dielectric filters.

It should be noted that the transmit filter 13, the receive filter 23, the low-noise amplifier 21, and the receive-signal output terminal 120 are non-essential constituent elements in the radio-frequency module according to the present disclosure. When the receive filter 23, the low-noise amplifier 21, and the receive-signal output terminal 120 are not provided, the communication device 8 is a system of transmitting radio-frequency signals in a predetermined transmit band.

The radio-frequency module 1 may include at least any of the transmit filter 13, the receive filter 23, and the low-noise amplifier 21; in other words, the power amplifier 11, the PA control circuit 12, the transmit filter 13, the receive filter 23, and the low-noise amplifier 21 may be mounted on one mounting board.

The radio-frequency module 1 according to the embodiment may transfer radio-frequency signals in a plurality of communication bands in addition to the predetermined communication bands. In this case, the radio-frequency module 1 is formed by adding transmit power amplifiers and receive low-noise amplifiers that amplify radio-frequency signals in communication bands other than the predetermined communication bands, transmit filters and receive filters that pass radio-frequency signals in the communication bands other than the predetermined communication bands, and switches for switching the transmit power amplifiers, the receive low-noise amplifiers, the transmit filters, and the receive filters.

The following is a description of a structure that can improve the heat dissipation capability of the radio-frequency module 1 according to the embodiment.

[2. Arrangement of Circuit Elements of Radio-Frequency Module 1A According to First Practical Example]

Figure 2A:
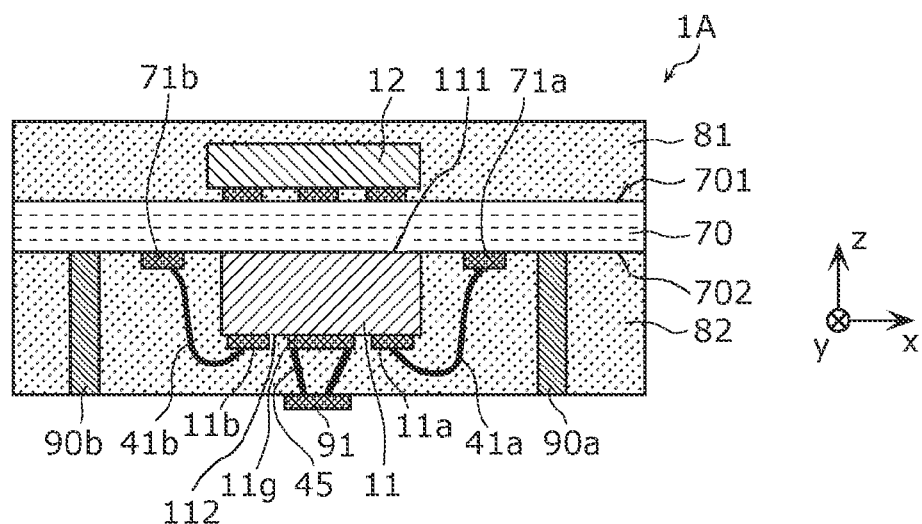
FIG. 2A is a schematic diagram illustrating a structure of a radio-frequency module according to a first practical example in section.

FIG. 2A is a schematic diagram illustrating a structure of a radio-frequency module 1A according to a first practical example in section. The radio-frequency module 1A according to the first practical example illustrated in FIG. 2A is an example of a structure of a module implementing the circuit configuration of the radio-frequency module 1 according to the embodiment.

As illustrated in FIG. 2A, the radio-frequency module 1A according to this practical example includes, in addition to the circuit configuration of the radio-frequency module 1 illustrated in FIG. 1, a module substrate 70, resin members 81 and 82, external connection terminals 90a and 90b, bonding wires 41a, 41b, and 45, and a heat dissipation electrode 91.

The module substrate 70 is a mounting board having a major surface 701 (first major surface) and a major surface 702 (second major surface) opposite to each other, on each of which circuit components can be mounted. As the module substrate 70, for example, a low temperature co-fired ceramics (LTCC) substrate having a layered structure composed of a plurality of dielectric layers, a high temperature co-fired ceramics (HTCC) substrate, a component-embedded substrate, a substrate including a redistribution layer (RDL), or a printed board is used.

The radio-frequency module 1A according to this practical example is coupled to an external substrate. As viewed with respect to the radio-frequency module 1A, the external substrate is disposed on the major surface 702 side (reverse direction side of the Z axis) of the major surfaces 701 and 702, facing toward the module substrate 70. The external substrate has a connection electrode on a surface on the forward direction side of the Z axis. The connection electrode is coupled to the external connection terminals 90a and 90b and the heat dissipation electrode 91. The external substrate may be, for example, a mother substrate of a device such as a mobile phone or communication device.

The external connection terminals 90a and 90b are disposed on the major surface 702 and coupled to the external substrate. Specifically, of each of the external connection terminals 90a and 90b, an end portion on the forward direction side of the Z axis is coupled to the major surface 702, and an end portion on the reverse direction side of the Z axis is coupled to the connection electrode of the external substrate. The external connection terminals 90a and 90b are, for example, columnar electrodes extended through the resin member 82 in the Z-axis direction. When the module substrate 70 is viewed in plan view, the external connection terminals 90a and 90b are disposed in a peripheral region of the radio-frequency module LA. The external connection terminals 90a and 90b are at least partially formed as a ground terminal at a ground potential. As such, the power amplifier 11 is surrounded by the external connection terminals 90a and 90b including the ground potential, and as a result, it is possible to reduce transmit signals and harmonic waves of the transmit signals leaking from the power amplifier 11 to the outside and also to reduce noise entering from the outside into the power amplifier 11.

The external connection terminals 90a and 90b may be partially formed as a hot terminal for transferring radio-frequency signals or direct-current voltage signals of, for example, a supply voltage or bias voltage.

The external connection terminals 90a and 90b may be, for example, cylindrical or square columnar electrodes or bump members (including solder balls).

The resin member 81 is disposed on the major surface 701 of the module substrate 70 to cover the PA control circuit 12 and the major surface 701. The resin member 81 has a function of securing the reliability of, for example, mechanical strength and moisture resistance of these circuit components. The resin member 82 is disposed on the major surface 702 of the module substrate 70 to cover the power amplifier 11 and the major surface 702. The resin member 82 has a function of securing the reliability of, for example, mechanical strength and moisture resistance of the power amplifier 11. The resin member 82 only needs to cover at least part of the power amplifier 11. The resin members 81 and 82 are non-essential constituent elements in the radio-frequency module according to the present disclosure.

As illustrated in FIG. 2A, in the radio-frequency module 1A according to this practical example, the power amplifier 11 is surface mounted on the major surface 702 of the module substrate 70, while the PA control circuit 12 is surface mounted on the major surface 701 of the module substrate 70. As such, the power amplifier 11 and the PA control circuit 12 are mounted separately on both mounting surfaces (major surfaces 701 and 702) of the module substrate 70, and as a result, the radio-frequency module 1A can be smaller than a radio-frequency module having a single-sided mounting board. The PA control circuit 12 may be mounted on the major surface 702 or disposed in the module substrate 70.

The power amplifier 11 has a major surface 111 (third major surface) and a major surface 112 (fourth major surface) opposite to each other. The power amplifier 11 is mounted on the module substrate 70 such that the major surface 111 is joined to the major surface 702. In this practical example, the major surface 111 of the power amplifier 11 and the major surface 702 of the module substrate 70 are joined to each other by using, for example, an adhesive.

Hereinafter, a circuit configuration of the power amplifier 11 will be described.

Figure 2B:
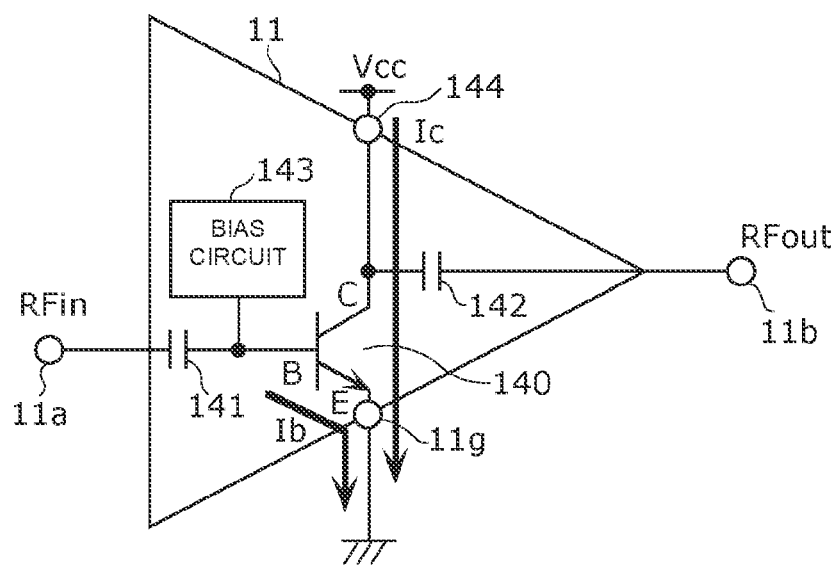
FIG. 2B is a circuit configuration diagram of a power amplifier according to the first practical example.

FIG. 2B is a circuit configuration diagram of the power amplifier 11 included in the radio-frequency module 1A according to the first practical example. As illustrated in the drawing, the power amplifier 11 includes a transistor 140, capacitors 141 and 142, a bias circuit 143, a collector electrode 144, a ground electrode 11g, the input electrode 11a, and the output electrode 11b.

The transistor 140 is, for example, a common-emitter bipolar transistor having a collector, an emitter, and a base and configured to amplify a radio-frequency current inputted to the base and output the amplified radio-frequency current from the collector. The transistor 140 may be a FET having a drain, a source, and a gate.

The capacitor 141 is a direct-current blocking capacitive element having a function of blocking the direct current leaking into the input electrode 11a in response to the direct-current bias voltage applied by the bias circuit 143.

The capacitor 142 is a direct-current blocking capacitive element having a function of removing from an amplified radio-frequency signal a direct-current component generated by adding the direct-current bias voltage; the amplified radio-frequency signal without the direct-current component is outputted from the output electrode 11b.

The bias circuit 143 electrically coupled to the base of the transistor 140 has a function of optimizing the operating point of the transistor 140 by applying a bias voltage to the base of the transistor 140.

In the circuit configuration of the power amplifier 11 described above, a radio-frequency signal RFin inputted from the input electrode 11a serves as a base current Ib flowing from the base of the transistor 140 to the emitter of the transistor 140. The base current Ib is amplified by the transistor 140, a collector current Ic is accordingly generated, and a radio-frequency signal RFout corresponding to the collector current Ic is outputted from the output electrode 11b. At this time, a large current formed by adding together the base current Ib and the collector current Ic flows from the emitter to the ground electrode 11g.

Referring back to FIG. 2A, the structure of the radio-frequency module 1A is described.

The input electrode 11a, the output electrode 11b, and the ground electrode 11g of the power amplifier 11 are formed on the major surface 112. The input electrode 11a is an example of an input-output electrode. The input electrode 11a is coupled by the bonding wire 41a (second bonding wire) to an input terminal 71a (input-output terminal) formed on the major surface 702 of the module substrate 70. The output electrode 11b is an example of the input-output electrode. The output electrode 11b is coupled by the bonding wire 41b (second bonding wire) to an output terminal 71b (input-output terminal) formed on the major surface 702 of the module substrate 70.

The ground electrode 11g is coupled to one end of the bonding wire 45 (first bonding wire). The other end of the bonding wire 45 is exposed at a surface of the resin member 82 on the reverse direction side of the Z axis. The heat dissipation electrode 91 is disposed apart from the power amplifier 11 on the major surface 112 side with respect to the power amplifier 11. The other end of the bonding wire 45 is coupled to the heat dissipation electrode 91 at the surface of the resin member 82 on the reverse direction side of the Z axis. The heat dissipation electrode 91 is formed on the surface of the resin member 82 on the reverse direction side of the Z axis and exposed from the resin member 82. With this structure, it is possible to dissipate from the heat dissipation electrode 91 the heat generated in the power amplifier 11 in response to the large current formed by adding together the base current Ib and the collector current Ic.

A plurality of ground electrodes 11g may be provided on the major surface 112. In response to this, a plurality of bonding wires 45 may be provided. Further, in response to this, a plurality of heat dissipation electrodes 91 may be provided. This can improve the capability of dissipating the heat from the heat dissipation electrode 91.

The heat dissipation electrode 91 may be coupled to a ground terminal on the external substrate. This structure enables the heat in the power amplifier 11 to be dissipated through the external substrate, and as a result, the heat dissipation capability of the radio-frequency module 1A can be higher than when the heat dissipation electrode 91 is not coupled to the external substrate.

With the structure of the radio-frequency module 1A described above, the circuit components can be mounted on both mounting surfaces (major surfaces 701 and 702) of the module substrate 70, and consequently, the radio-frequency module 1A can be denser and smaller than a radio-frequency module having a single-sided mounting board.

The power amplifier 11 of a relatively large amount of heat generation is mounted on the major surface 702 that is closer to the external substrate between the major surfaces 701 and 702. In this structure, the ground electrode 11g included in the heat dissipation path of the power amplifier 11 is formed on the major surface 112 close to the external substrate and coupled to the heat dissipation electrode 91 through the bonding wire 45. Because the bonding wire 45 is not routed via the module substrate 70, the bonding wire 45 is shorter than the bonding wire 41a for transferring input signals and the bonding wire 41b for transferring output signals, and as a result, the thermal resistance of the bonding wire 45 can be relatively low. As such, the heat dissipation path of the power amplifier 11 extends from the major surface 112 of the power amplifier 11 through the bonding wire 45 to the heat dissipation electrode 91, without being routed via a planar wiring pattern disposed at the module substrate 70 in parallel to the major surface 702. As a result, in the structure in which the power amplifier 11 is mounted on the major surface 702 close to the external substrate, the heat dissipation path extending from the major surface 112 close to the heat dissipation electrode 91 through the bonding wire 45 having a relatively low thermal resistance is formed instead of the heat dissipation path routed via a planar wiring pattern having a relatively high thermal resistance as compared to other wires in the module substrate 70. Consequently, it is possible to provide the small radio-frequency module 1A with the improved capability of heat dissipation of the power amplifier 11.

A heat dissipation structure of the radio-frequency module 1A is formed in accordance with the following manufacturing process.

Firstly, the power amplifier 11 is mounted on the major surface 702.

Next, the bonding wire 41a coupling the input electrode 11a on the major surface 112 and the input terminal 71a on the major surface 702 is formed. The bonding wire 41b coupling the output electrode 11b on the major surface 112 and the output terminal 71b on the major surface 702 is also formed. The bonding wire 45 coupled to the ground electrode 11g on the major surface 112 is formed.

Next, the resin member 82 is formed on the major surface 702 to cover the power amplifier 11 and the bonding wires 41a, 41b, and 45.

Next, the external connection terminals 90a and 90b are formed to extend through the resin member 82.

Next, the surface of the resin member 82 on the reverse direction side of the Z axis is polished. As a result, the external connection terminals 90a and 90b and the bonding wire 45 are exposed from the resin member 82.

Finally, the heat dissipation electrode 91 is formed on the polished surface of the resin member 82 to be coupled to the bonding wire 45.

The heat dissipation structure of the radio-frequency module 1A can be formed by using the simplified manufacturing process described above.

[3. Arrangement of Circuit Elements of Radio-Frequency Module 1B According to First Modification]

Figure 3:
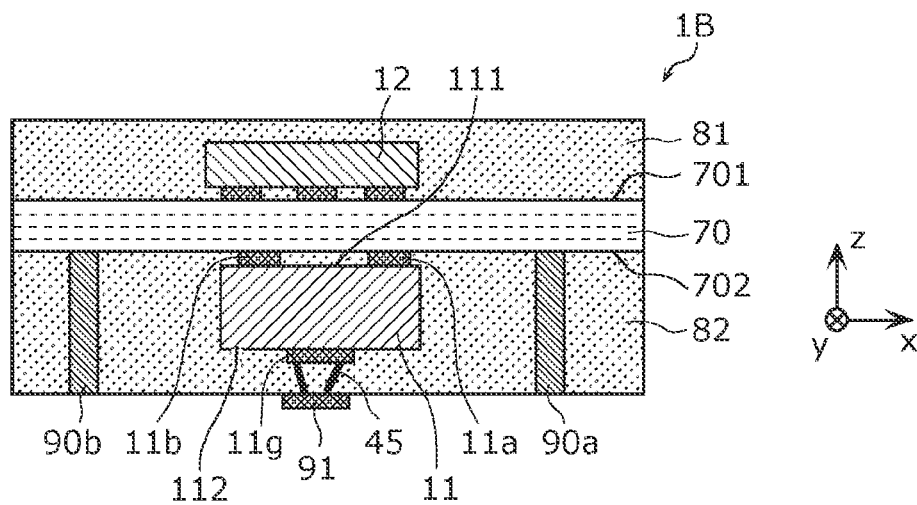
FIG. 3 is a schematic diagram illustrating a structure of a radio-frequency module according to a first modification in section.

FIG. 3 is a schematic diagram illustrating a structure of a radio-frequency module 1B according to a first modification in section. The radio-frequency module 1B according to the first modification illustrated in FIG. 3 is an example of a structure of a module implementing the circuit configuration of the radio-frequency module 1 according to the embodiment.

As illustrated in FIG. 3, the radio-frequency module 1B according to this modification includes, in addition to the circuit configuration of the radio-frequency module 1 illustrated in FIG. 1, the module substrate 70, the resin members 81 and 82, the external connection terminals 90a and 90b, the bonding wire 45, and the heat dissipation electrode 91. The radio-frequency module 1B according to this modification differs from the radio-frequency module 1A according to the first practical example in only the connections of the input-output electrodes of the power amplifier 11 and the module substrate 70. Hereinafter, concerning the radio-frequency module 1B according to this modification, descriptions of configurations identical to the configurations of the radio-frequency module 1A according to the first practical example are not repeated, and different configurations are mainly described.

The power amplifier 11 has the major surface 111 (third major surface) and the major surface 112 (fourth major surface) opposite to each other. The power amplifier 11 is mounted on the module substrate 70 such that the major surface 111 is joined to the major surface 702. In this modification, the major surface 111 of the power amplifier 11 and the major surface 702 of the module substrate 70 are joined to each other with the input electrode 11a and the output electrode 11b that are formed on the major surface 111 and interposed between the major surface 111 of the power amplifier 11 and the major surface 702 of the module substrate 70.

The input electrode 11a and the output electrode 11b of the power amplifier 11 are formed on the major surface 111. The ground electrode 11g is formed on the major surface 112. The input electrode 11a is an example of the input-output electrode. The input electrode 11a is coupled by a solder joint or bump electrode to an input terminal formed on the major surface 702 of the module substrate 70. The output electrode 11b is an example of the input-output electrode. The output electrode 11b is coupled by a solder joint or bump electrode to an output terminal formed on the major surface 702 of the module substrate 70.

With the structure of the radio-frequency module 1B described above, the circuit components can be mounted on both mounting surfaces (major surfaces 701 and 702) of the module substrate 70, and consequently, the radio-frequency module 1B can be denser and smaller than a radio-frequency module having a single-sided mounting board.

The power amplifier 11 of a relatively large amount of heat generation is mounted on the major surface 702 that is closer to the external substrate between the major surfaces 701 and 702. In this structure, the ground electrode 11g of the heat dissipation path of the power amplifier 11 is formed on the major surface 112 close to the external substrate and coupled to the heat dissipation electrode 91 through the bonding wire 45. As a result, in the structure in which the power amplifier 11 is mounted on the major surface 702 close to the external substrate, the heat dissipation path extending from the major surface 112 close to the heat dissipation electrode 91 through the bonding wire 45 having a relatively low thermal resistance is formed instead of the heat dissipation path routed via a planar wiring pattern having a relatively high thermal resistance as compared to other wires in the module substrate 70. Consequently, it is possible to provide the small radio-frequency module 1B with the improved capability of heat dissipation of the power amplifier 11. Additionally, the input-output electrodes of the power amplifier 11 are coupled to the input-output terminals on the module substrate 70 by, for example, bumps instead of bonding wires in the state in which the input-output electrodes of the power amplifier 11 and the input-output terminals on the module substrate 70 face each other, and thus, it is possible to reduce the area of the radio-frequency module 1B.

[4. Arrangement of Circuit Elements of Radio-Frequency Module 1C According to Second Practical Example]

Figure 4:
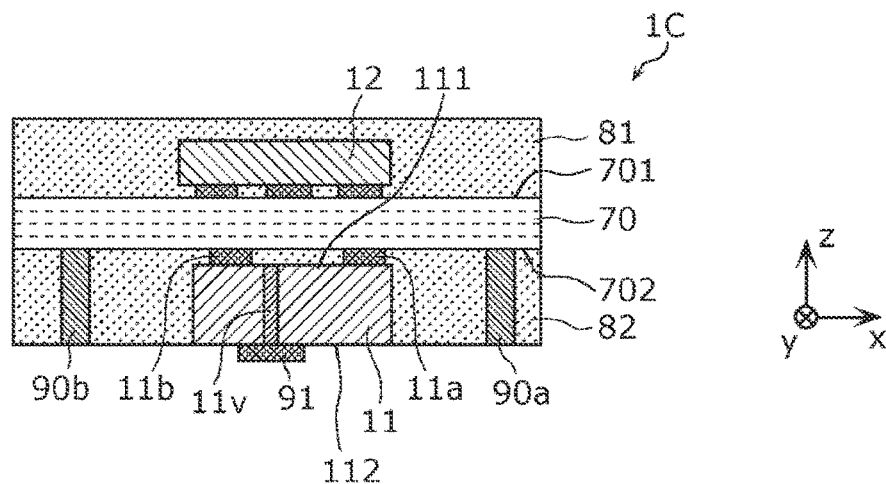
FIG. 4 is a schematic diagram illustrating a structure of a radio-frequency module according to a second practical example in section.

FIG. 4 is a schematic diagram illustrating a structure of a radio-frequency module 1C according to a second practical example in section. The radio-frequency module 1C according to the second practical example illustrated in FIG. 4 is an example of a structure of a module implementing the circuit configuration of the radio-frequency module 1 according to the embodiment.

As illustrated in FIG. 4, the radio-frequency module 1C according to this practical example includes, in addition to the circuit configuration of the radio-frequency module 1 illustrated in FIG. 1, the module substrate 70, the resin members 81 and 82, the external connection terminals 90a and 90b, and the heat dissipation electrode 91. The radio-frequency module 1C according to this practical example differs from the radio-frequency module 1B according to the first modification in the electrode structure and heat dissipation structure of the power amplifier 11. Hereinafter, concerning the radio-frequency module 1C according to this practical example, descriptions of configurations identical to the configurations of the radio-frequency module 1B according to the first modification are not repeated, and different configurations are mainly described.

The power amplifier 11 has the major surface 111 (third major surface) and the major surface 112 (fourth major surface) opposite to each other. The power amplifier 11 is mounted on the module substrate 70 such that the major surface 111 is joined to the major surface 702. In this practical example, the major surface 111 of the power amplifier 11 and the major surface 702 of the module substrate 70 are joined to each other with the input electrode 11a and the output electrode 11b that are formed on the major surface 111 and interposed between the major surface 111 of the power amplifier 11 and the major surface 702 of the module substrate 70. The major surface 112 of the power amplifier 11 is exposed from the resin member 82.

The power amplifier 11 has a through-substrate via 11v. The power amplifier 11 includes a circuit board having circuit elements such as the transistor 140. The through-substrate via 11v is a conductive via extended through the circuit board from the major surface 111 to the major surface 112. The through-substrate via 11v may be coupled to the ground electrode 11g illustrated in FIG. 2B inside the power amplifier 11.

The heat dissipation electrode 91 is disposed on the major surface 112 of the power amplifier 11. One end of the through-substrate via 11v is coupled to the heat dissipation electrode 91 at the surface of the resin member 82 on the reverse direction side of the Z axis. The heat dissipation electrode 91 is formed on the surface of the resin member 82 on the reverse direction side of the Z axis and exposed from the resin member 82. With this structure, it is possible to dissipate, from the heat dissipation electrode 91 through the through-substrate via 11v, the heat generated in the power amplifier 11 in response to the large current formed by adding together the base current Ib and the collector current Ic.

The heat dissipation electrode 91 may be coupled to the ground terminal on the external substrate. This structure enables the heat in the power amplifier 11 to be dissipated through the external substrate, and as a result, the heat dissipation capability of the radio-frequency module 1C can be higher than when the heat dissipation electrode 91 is not coupled to the external substrate.

With the structure of the radio-frequency module 1C described above, the circuit components can be mounted on both mounting surfaces (major surfaces 701 and 702) of the module substrate 70, and consequently, the radio-frequency module 1C can be denser and smaller than a radio-frequency module having a single-sided mounting board.

The power amplifier 11 of a relatively large amount of heat generation is mounted on the major surface 702 that is closer to the external substrate between the major surfaces 701 and 702. In this structure, the heat dissipation electrode 91 of the heat dissipation path of the power amplifier 11 is formed on the major surface 112 exposed from the resin member 82. As a result, in the structure in which the power amplifier 11 is mounted on the major surface 702 close to the external substrate, the heat dissipation path extending through the through-substrate via 11v having a relatively low thermal resistance is formed instead of the heat dissipation path routed via a planar wiring pattern having a relatively high thermal resistance as compared to other wires in the module substrate 70. Consequently, it is possible to provide the small radio-frequency module 1C with the improved capability of heat dissipation of the power amplifier 11. Additionally, the input-output electrodes of the power amplifier 11 are coupled to the input-output terminals on the module substrate 70 by, for example, bumps instead of bonding wires in the state in which the input-output electrodes of the power amplifier 11 and the input-output terminals on the module substrate 70 face each other, and thus, it is possible to reduce the area of the radio-frequency module 1C.

A heat dissipation structure of the radio-frequency module 1C is formed in accordance with the following manufacturing process.

Firstly, the power amplifier 11 including the through-substrate via 11v is mounted on the major surface 702.

Next, the resin member 82 is formed on the major surface 702 to cover the power amplifier 11.

Next, the external connection terminals 90a and 90b are formed to extend through the resin member 82.

Next, the surface of the resin member 82 on the reverse direction side of the Z axis is polished. As a result, the external connection terminals 90a and 90b and the major surface 112 (and the through-substrate via 11v) of the power amplifier 11 are exposed from the resin member 82.

Finally, the heat dissipation electrode 91 is formed on the major surface 112 and the polished surface of the resin member 82 to be coupled to the through-substrate via 11v.

The heat dissipation structure of the radio-frequency module 1C can be formed by using the simplified manufacturing process described above.

[5. Arrangement of Circuit Elements of Radio-Frequency Module 1D According to Second Modification]

Figure 5:
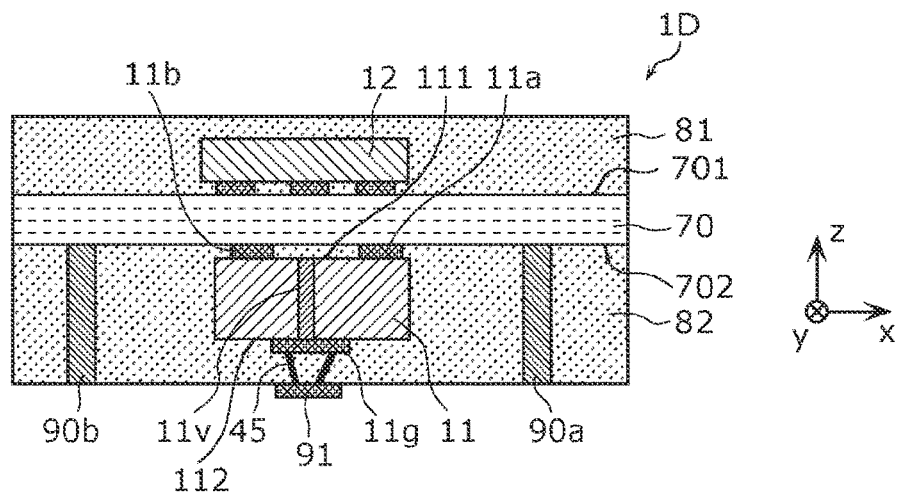
FIG. 5 is a schematic diagram illustrating a structure of a radio-frequency module according to a second modification in section.

FIG. 5 is a schematic diagram illustrating a structure of a radio-frequency module 1D according to a second modification in section. The radio-frequency module 1D according to the second modification illustrated in FIG. 5 is an example of a structure of a module implementing the circuit configuration of the radio-frequency module 1 according to the embodiment.

As illustrated in FIG. 5, the radio-frequency module 1D according to this modification includes, in addition to the circuit configuration of the radio-frequency module 1 illustrated in FIG. 1, the module substrate 70, the resin members 81 and 82, the external connection terminals 90a and 90b, the heat dissipation electrode 91, and the bonding wire 45.

The radio-frequency module 1D according to this modification differs from the radio-frequency module 1C according to the second practical example in the heat dissipation structure of the power amplifier 11. Hereinafter, concerning the radio-frequency module 1D according to this modification, descriptions of configurations identical to the configurations of the radio-frequency module 1C according to the second practical example are not repeated, and different configurations are mainly described.

The power amplifier 11 has the major surface 111 (third major surface) and the major surface 112 (fourth major surface) opposite to each other. The power amplifier 11 is mounted on the module substrate 70 such that the major surface 111 is joined to the major surface 702. In this modification, the major surface 111 of the power amplifier 11 and the major surface 702 of the module substrate 70 are joined to each other with the input electrode 11a and the output electrode 11b that are formed on the major surface 111 and interposed between the major surface 111 of the power amplifier 11 and the major surface 702 of the module substrate 70.

The input electrode 11a and the output electrode 11b of the power amplifier 11 are formed on the major surface 111. The ground electrode 11g is formed on the major surface 112. The input electrode 11a is an example of the input-output electrode. The input electrode 11a is coupled by a solder joint or bump electrode to an input terminal formed on the major surface 702 of the module substrate 70. The output electrode 11b is an example of the input-output electrode. The output electrode 11b is coupled by a solder joint or bump electrode to an output terminal formed on the major surface 702 of the module substrate 70.

The ground electrode 11g is disposed on the major surface 112 of the power amplifier 11. One end of the through-substrate via 11v is coupled to the ground electrode 11g at the surface of the resin member 82 on the reverse direction side of the Z axis. The ground electrode 11g is formed on the surface of the resin member 82 on the reverse direction side of the Z axis.

The ground electrode 11g is coupled to one end of the bonding wire 45 (third bonding wire). The other end of the bonding wire 45 is exposed at a surface of the resin member 82 on the reverse direction side of the Z axis. The heat dissipation electrode 91 is disposed apart from the power amplifier 11 on the major surface 112 side with respect to the power amplifier 11. The other end of the bonding wire 45 is coupled to the heat dissipation electrode 91 at the surface of the resin member 82 on the reverse direction side of the Z axis. The heat dissipation electrode 91 is formed on the surface of the resin member 82 on the reverse direction side of the Z axis and exposed from the resin member 82. With this structure, it is possible to dissipate from the heat dissipation electrode 91 the heat generated in the power amplifier 11 in response to the large current formed by adding together the base current Ib and the collector current Ic.

The heat dissipation electrode 91 may be coupled to the ground terminal on the external substrate. This structure enables the heat in the power amplifier 11 to be dissipated through the external substrate, and as a result, the heat dissipation capability of the radio-frequency module 1D can be higher than when the heat dissipation electrode 91 is not coupled to the external substrate.

With the structure of the radio-frequency module 1D described above, the circuit components can be mounted on both mounting surfaces (major surfaces 701 and 702) of the module substrate 70, and consequently, the radio-frequency module 1D can be denser and smaller than a radio-frequency module having a single-sided mounting board.

The power amplifier 11 of a relatively large amount of heat generation is mounted on the major surface 702 that is closer to the external substrate between the major surfaces 701 and 702. In this structure, the heat dissipation electrode 91 of the heat dissipation path of the power amplifier 11 is exposed from the resin member 82. As a result, in the structure in which the power amplifier 11 is mounted on the major surface 702 close to the external substrate, the heat dissipation path extending through the through-substrate via 11v having a relatively low thermal resistance and the bonding wire 45 having a relatively low thermal resistance is formed instead of the heat dissipation path routed via a planar wiring pattern having a relatively high thermal resistance as compared to other wires in the module substrate 70. Consequently, it is possible to provide the small radio-frequency module 1D with the improved capability of heat dissipation of the power amplifier 11. Additionally, the input-output electrodes of the power amplifier 11 are coupled to the input-output terminals on the module substrate 70 by, for example, bumps instead of bonding wires in the state in which the input-output electrodes of the power amplifier 11 and the input-output terminals on the module substrate 70 face each other, and thus, it is possible to reduce the area of the radio-frequency module 1D.

[6. Arrangement of Circuit Elements of Radio-Frequency Module 1E According to Third Modification]

Figure 6:
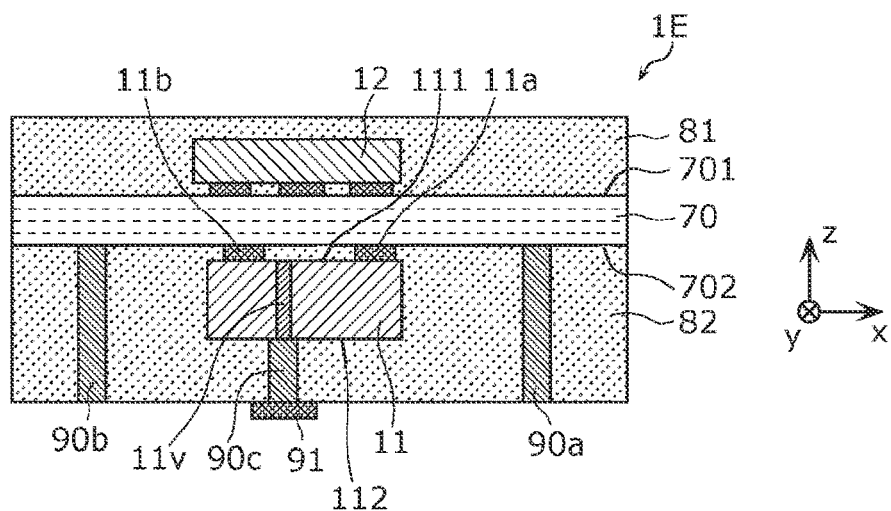
FIG. 6 is a schematic diagram illustrating a structure of a radio-frequency module according to a third modification in section.

FIG. 6 is a schematic diagram illustrating a structure of a radio-frequency module 1E according to a third modification in section. The radio-frequency module 1E according to the third modification illustrated in FIG. 6 is an example of a structure of a module implementing the circuit configuration of the radio-frequency module 1 according to the embodiment.

As illustrated in FIG. 6, the radio-frequency module 1E according to this modification includes, in addition to the circuit configuration of the radio-frequency module 1 illustrated in FIG. 1, the module substrate 70, the resin members 81 and 82, the external connection terminals 90a and 90b, the heat dissipation electrode 91, and a columnar electrode 90c. The radio-frequency module 1E according to this modification differs from the radio-frequency module 1D according to the second modification in the heat dissipation structure of the power amplifier 11. Hereinafter, concerning the radio-frequency module 1E according to this modification, descriptions of configurations identical to the configurations of the radio-frequency module 1D according to the second modification are not repeated, and different configurations are mainly described.

The power amplifier 11 has the major surface 111 (third major surface) and the major surface 112 (fourth major surface) opposite to each other. The power amplifier 11 is mounted on the module substrate 70 such that the major surface 111 is joined to the major surface 702. In this modification, the major surface 111 of the power amplifier 11 and the major surface 702 of the module substrate 70 are joined to each other with the input electrode 11a and the output electrode 11b that are formed on the major surface 111 and interposed between the major surface 111 of the power amplifier 11 and the major surface 702 of the module substrate 70.

One end of the columnar electrode 90c is coupled to the major surface 112 of the power amplifier 11. The columnar electrode 90c elongates in a direction (Z-axis direction) from the major surface 111 to the major surface 112. One end of the through-substrate via 11v is coupled to the one end of the columnar electrode 90c at the surface of the resin member 82 on the reverse direction side of the Z axis. The heat dissipation electrode 91 is disposed apart from the power amplifier 11 on the major surface 112 side with respect to the power amplifier 11. The other end of the columnar electrode 90c is coupled to the heat dissipation electrode 91 at the surface of the resin member 82 on the reverse direction side of the Z axis. The heat dissipation electrode 91 is formed on the surface of the resin member 82 on the reverse direction side of the Z axis and exposed from the resin member 82. With this structure, it is possible to dissipate from the heat dissipation electrode 91 the heat generated in the power amplifier 11 in response to the large current formed by adding together the base current Ib and the collector current Ic.

The heat dissipation electrode 91 may be coupled to the ground terminal on the external substrate. This structure enables the heat in the power amplifier 11 to be dissipated through the external substrate, and as a result, the heat dissipation capability of the radio-frequency module 1E can be higher than when the heat dissipation electrode 91 is not coupled to the external substrate.

With the structure of the radio-frequency module 1E described above, the circuit components can be mounted on both mounting surfaces (major surfaces 701 and 702) of the module substrate 70, and consequently, the radio-frequency module 1E can be denser and smaller than a radio-frequency module having a single-sided mounting board.

The power amplifier 11 of a relatively large amount of heat generation is mounted on the major surface 702 that is closer to the external substrate between the major surfaces 701 and 702. In this structure, the heat dissipation electrode 91 of the heat dissipation path of the power amplifier 11 is exposed from the resin member 82. As a result, in the structure in which the power amplifier 11 is mounted on the major surface 702 close to the external substrate, the heat dissipation path extending through the through-substrate via 11v having a relatively low thermal resistance and the columnar electrode 90c having a relatively low thermal resistance is formed instead of the heat dissipation path routed via a planar wiring pattern having a relatively high thermal resistance as compared to other wires in the module substrate 70. Consequently, it is possible to provide the small radio-frequency module 1E with the improved capability of heat dissipation of the power amplifier 11. Additionally, the input-output electrodes of the power amplifier 11 are coupled to the input-output terminals on the module substrate 70 by, for example, bumps instead of bonding wires in the state in which the input-output electrodes of the power amplifier 11 and the input-output terminals on the module substrate 70 face each other, and thus, it is possible to reduce the area of the radio-frequency module 1E.

[7. Effects]

As described above, the radio-frequency module 1 according to the embodiment includes the module substrate 70 having the major surfaces 701 and 702 opposite to each other, the external connection terminals 90a and 90b disposed on the major surface 702 and coupled to the external substrate, the power amplifier 11 having the major surfaces 111 and 112 opposite to each other and being disposed on the major surface 702 such that the major surface 111 is a mounting surface on the module substrate 70, the bonding wire 45 coupled to the major surface 112, and the heat dissipation electrode 91 disposed apart from the power amplifier 11 on the major surface 112 side with respect to the power amplifier 11 and coupled to the bonding wire 45.

In this structure, the power amplifier 11 of a relatively large amount of heat generation is mounted on the major surface 702 that is closer to the external substrate between the major surfaces 701 and 702. In this structure, the power amplifier 11 is coupled to the heat dissipation electrode 91 via the bonding wire 45 formed on the major surface 112 close to the external substrate. Because the bonding wire 45 is not routed via the module substrate 70, the thermal resistance of the bonding wire 45 can be relatively low. As such, the heat dissipation path of the power amplifier 11 extends from the major surface 112 of the power amplifier 11 through the bonding wire 45 to the heat dissipation electrode 91, without being routed via a planar wiring pattern disposed at the module substrate 70 in parallel to the major surface 702. Consequently, it is possible to provide the small radio-frequency module 1 with the improved capability of heat dissipation of the power amplifier 11.

The power amplifier 11 may include the input electrode 11a and the output electrode 11b that are formed on the major surface 112. The radio-frequency module 1 may further include the input terminal 71a and the output terminal 71b that are formed on the major surface 702, the bonding wire 41a coupling the input electrode 11a and the input terminal 71a, and the bonding wire 41b coupling the output electrode 11b and the output terminal 71b.

Furthermore, the power amplifier 11 may include the input electrode 11a and the output electrode 11b that are formed on the major surface 111. The major surface 111 may be joined to the major surface 702 with the input electrode 11a and the output electrode 11b interposed between the major surface 111 and the major surface 702.

As a result, the input-output electrodes of the power amplifier 11 are coupled to the input-output terminals on the module substrate 70 by, for example, bumps instead of bonding wires in the state in which the input-output electrodes of the power amplifier 11 and the input-output terminals on the module substrate 70 face each other, and thus, it is possible to reduce the area of the radio-frequency module 1.

Moreover, the radio-frequency module 1 according to the embodiment may include the module substrate 70 having the major surfaces 701 and 702 opposite to each other, the external connection terminals 90a and 90b disposed on the major surface 702 and coupled to the external substrate, the power amplifier 11 having the major surfaces 111 and 112 opposite to each other and being disposed on the major surface 702 such that the major surface 111 is a mounting surface on the module substrate 70, and the heat dissipation electrode 91 disposed on the major surface 112 side with respect to the power amplifier 11. The power amplifier 11 may include the through-substrate via 11v extended through a circuit board including an amplification element in a direction from the major surface 111 to the major surface 112. The heat dissipation electrode 91 and the through-substrate via 11v may be coupled to each other.

In this structure, the heat dissipation electrode 91 of the heat dissipation path of the power amplifier 11 is disposed on the major surface 112 side. As a result, in the structure in which the power amplifier 11 is mounted on the major surface 702 close to the external substrate, the heat dissipation path extending through the through-substrate via 11v having a relatively low thermal resistance is formed instead of the heat dissipation path routed via a planar wiring pattern having a relatively high thermal resistance as compared to other wires in the module substrate 70. Consequently, it is possible to provide the small radio-frequency module 1 with the improved capability of heat dissipation of the power amplifier 11.

Furthermore, the radio-frequency module 1 according to the embodiment may further include the bonding wire 45 coupled to the major surface 112. The heat dissipation electrode 91 and the through-substrate via 11v may be coupled to each other via the bonding wire 45.

As a result, in the structure in which the power amplifier 11 is mounted on the major surface 702 close to the external substrate, the heat dissipation path extending through the through-substrate via 11v having a relatively low thermal resistance and the bonding wire 45 having a relatively low thermal resistance is formed instead of the heat dissipation path routed via a planar wiring pattern having a relatively high thermal resistance as compared to other wires in the module substrate 70. Consequently, it is possible to provide the small radio-frequency module 1 with the improved capability of heat dissipation of the power amplifier 11.

Further, the radio-frequency module 1 according to the embodiment may further include the columnar electrode 90c coupled to the major surface 112. The heat dissipation electrode 91 and the through-substrate via 11v may be coupled to each other via the columnar electrode 90c.

As a result, in the structure in which the power amplifier 11 is mounted on the major surface 702 close to the external substrate, the heat dissipation path extending through the through-substrate via 11v having a relatively low thermal resistance and the columnar electrode 90c having a relatively low thermal resistance is formed instead of the heat dissipation path routed via a planar wiring pattern having a relatively high thermal resistance as compared to other wires in the module substrate 70. Consequently, it is possible to provide the small radio-frequency module 1 with the improved capability of heat dissipation of the power amplifier 11.

Moreover, the heat dissipation electrode 91 may be a ground electrode and coupled to the external substrate.

This structure enables the heat in the power amplifier 11 to be dissipated through the external substrate, and as a result, the heat dissipation capability of the radio-frequency module 1 can be higher than when the heat dissipation electrode 91 is not coupled to the external substrate.

Furthermore, the radio-frequency module 1 according to the embodiment may further include the PA control circuit 12 disposed on the major surface 701 and configured to control the gain of the power amplifier 11.

In this structure, the circuit components can be mounted on both mounting surfaces (major surfaces 701 and 702) of the module substrate 70, and consequently, the radio-frequency module 1 can be denser and smaller than a radio-frequency module having a single-sided mounting board.

Further, the radio-frequency module 1 according to the embodiment may further include the resin member 82 formed on the major surface 702 and covering at least part of the power amplifier 11. The heat dissipation electrode 91 may be exposed from the resin member 82.

This structure can improve the heat dissipation capability of the radio-frequency module 1.

Moreover, the communication device 8 includes the RFIC 6 configured to process a radio-frequency signal received or to be transmitted by the antenna 5, and the radio-frequency module 1 configured to transfer the radio-frequency signal between the antenna 5 and the RFIC 6.

With this configuration, it is possible to provide the small communication device 8 with an improved capability of heat dissipation of the power amplifier 11.

OTHER EMBODIMENTS

Although the radio-frequency module and communication device according to the present disclosure have been described above by using the embodiment, the radio-frequency module and communication device according to the present disclosure are not limited to the embodiment described above. The present disclosure also embraces other embodiments implemented as any combination of the constituent elements of the embodiment, other modified examples obtained by making various modifications that occur to those skilled in the art without departing from the scope of the embodiment described above, and various hardware devices including the radio-frequency module and communication device.

For example, in the radio-frequency module and communication device according to the embodiment described above, another circuit element, wiring, and the like may also be inserted in paths connecting any of the circuit components and signal paths that are illustrated in the drawings.

The present disclosure can be used as a small radio-frequency module provided at the front-end for a wide variety of communication devices such as mobile phones.

1, 1A, 1B, 1C, 1D, 1E radio-frequency module
5 antenna
6 radio-frequency signal processing circuit (RFIC)
7 baseband signal processing circuit (BBIC)
8 communication device
11 power amplifier
11a input electrode
11b output electrode
11g ground electrode
11v through-substrate via
12 PA control circuit
13 transmit filter
21 low-noise amplifier
23 receive filter
41a, 41b, 45 bonding wire
70 module substrate
71a input terminal
71b output terminal
81, 82 resin member
90a, 90b external connection terminal
90c columnar electrode
91 heat dissipation electrode
100 common terminal
110 transmit-signal input terminal
111, 112, 701, 702 major surface
120 receive-signal output terminal
130a, 130b control signal terminal
140 transistor
141, 142 capacitor
143 bias circuit
144 collector electrode

The invention claimed is:

1. A radio-frequency module comprising:
a mounting board having a first major surface and a second major surface opposite to each other;
an external connection terminal disposed on the second major surface;
a power amplifier having a third major surface and a fourth major surface opposite to each other, the power amplifier being disposed on the second major surface such that the third major surface is a mounting surface on the mounting board;
a first bonding wire coupled to the fourth major surface; and
a heat dissipation electrode disposed apart from the power amplifier at a side of the fourth major surface with respect to the power amplifier, the heat dissipation electrode being coupled to the first bonding wire,
wherein
the power amplifier includes an input-output electrode provided on the fourth major surface,
the radio-frequency module further comprises:
an input-output terminal provided on the second major surface; and
a second bonding wire coupling the input-output electrode and the input-output terminal.

2. The radio-frequency module according to claim 1, wherein
the heat dissipation electrode is a ground electrode and coupled to an external substrate.

3. The radio-frequency module according to claim 1, further comprising:
a control circuit disposed on the first major surface, the control circuit being configured to control a gain of the power amplifier.

4. The radio-frequency module according to claim 1, further comprising:
a resin member provided on the second major surface, the resin member covering at least part of the power amplifier, wherein
the heat dissipation electrode is exposed from the resin member.

5. A communication device comprising:
a radio-frequency signal processing circuit configured to process a radio-frequency signal received or to be transmitted by an antenna; and
the radio-frequency module according to claim 1, the radio-frequency module being configured to transfer the radio-frequency signal between the antenna and the radio-frequency signal processing circuit.

6. The radio-frequency module according to claim 1, wherein
the heat dissipation electrode is a ground electrode and coupled to an external substrate.

7. The radio-frequency module according to claim 1, further comprising:
a control circuit disposed on the first major surface, the control circuit being configured to control a gain of the power amplifier.

8. A radio-frequency module comprising:
a mounting board having a first major surface and a second major surface opposite to each other;
an external connection terminal disposed on the second major surface;
a power amplifier having a third major surface and a fourth major surface opposite to each other, the power amplifier being disposed on the second major surface such that the third major surface is a mounting surface on the mounting board;
a first bonding wire coupled to the fourth major surface; and
a heat dissipation electrode disposed apart from the power amplifier at a side of the fourth major surface with respect to the power amplifier, the heat dissipation electrode being coupled to the first bonding wire,
wherein
the power amplifier includes an input-output electrode provided on the third major surface, and the third major surface is joined to the second major surface with the input-output electrode interposed between the third major surface and the second major surface.

9. The radio-frequency module according to claim 8, wherein
the heat dissipation electrode is a ground electrode and coupled to an external substrate.

10. A radio-frequency module comprising:
a mounting board having a first major surface and a second major surface opposite to each other;
an external connection terminal disposed on the second major surface;
a power amplifier having a third major surface and a fourth major surface opposite to each other, the power amplifier being disposed on the second major surface such that the third major surface is a mounting surface on the mounting board; and
a heat dissipation electrode disposed at a side of the fourth major surface with respect to the power amplifier, wherein
the power amplifier includes
an amplification element,
a circuit board having the amplification element, and
a through via extended through the circuit board in a direction from the third major surface to the fourth major surface, and
the heat dissipation electrode and the through via are coupled to each other.

11. The radio-frequency module according to claim 10, further comprising:
a third bonding wire coupled to the fourth major surface, wherein
the heat dissipation electrode and the through via are coupled to each other with the third bonding wire interposed between the heat dissipation electrode and the through via.

12. The radio-frequency module according to claim 11, wherein
the power amplifier includes an input-output electrode provided on the third major surface, and
the third major surface is joined to the second major surface with the input-output electrode interposed between the third major surface and the second major surface.

13. The radio-frequency module according to claim 11, wherein
the power amplifier includes an input-output electrode provided on the third major surface, and
the third major surface is joined to the second major surface with the input-output electrode interposed between the third major surface and the second major surface.

14. The radio-frequency module according to claim 11, wherein
the heat dissipation electrode is a ground electrode and coupled to an external substrate.

15. The radio-frequency module according to claim 10, further comprising:
a columnar electrode coupled to the fourth major surface, the columnar electrode elongating in the direction, wherein
the heat dissipation electrode and the through via are coupled to each other with the columnar electrode interposed between the heat dissipation electrode and the through via.

16. The radio-frequency module according to claim 15, wherein
the heat dissipation electrode is a ground electrode and coupled to an external substrate.

17. The radio-frequency module according to claim 10, wherein
the power amplifier includes an input-output electrode provided on the third major surface, and
the third major surface is joined to the second major surface with the input-output electrode interposed between the third major surface and the second major surface.

18. The radio-frequency module according to claim 17, wherein
the heat dissipation electrode is a ground electrode and coupled to an external substrate.

19. The radio-frequency module according to claim 10, wherein
the heat dissipation electrode is a ground electrode and coupled to an external substrate.

* * * * *